US005268539A

United States Patent [19]

Ono

[11] Patent Number: 5,268,539

[45] Date of Patent: Dec. 7, 1993

[54] ACOUSTIC APPARATUS

[76] Inventor: Hiroshi Ono, No. 10-15, Koyama, 7-chome, Shinagawa-ku, Tokyo, Japan

[21] Appl. No.: 46,391

[22] Filed: Apr. 9, 1993

Related U.S. Application Data

[63] Continuation of Ser. No. 853,026, Mar. 18, 1992, abandoned, which is a continuation of Ser. No. 560,761, Jul. 31, 1990, abandoned.

[30] Foreign Application Priority Data

Aug. 4, 1989 [JP] Japan .................................. 1-202601
Aug. 4, 1989 [JP] Japan .................................. 1-202602
Apr. 25, 1990 [JP] Japan .................................. 2-107441

[51] Int. Cl.[5] .......................... H05K 5/00; E04B 1/99; A47B 81/06; G03B 31/00

[52] U.S. Cl. ...................................... 181/155; 181/30; 181/199; 352/35

[58] Field of Search ................. 181/155, 176, 30, 153, 181/199; 352/34, 35, 36

[56] References Cited

U.S. PATENT DOCUMENTS 965,326 7/1910 Prescott ............................ 181/176
1,120,858 12/1914 Stallforth ............................ 181/30
3,944,757 3/1976 Tsukamoto ..................... 181/152 X
4,629,030 12/1986 Ferralli et al. ...................... 181/155
4,836,328 6/1989 Ferralli ................................ 181/155
4,844,198 7/1989 Ferralli ................................ 181/155

*Primary Examiner*—Michael L. Gellner
*Assistant Examiner*—Jae N. Noh
*Attorney, Agent, or Firm*—Wegner, Cantor, Mueller & Player

[57] ABSTRACT

An acoustic apparatus adapted to be heard only by a specific person or persons in one space without being worn by the user as in the case of an earphone. Sounds issuing from the apparatus do not leak to the outside and are not affected by the surrounding noise. Basically, the apparatus is arranged such that a sound source is disposed in one focus of a reflector having an ellipsoidal surface of revolution, and sounds are heard at the other focus. To increase the number of specific hearers, if the central portion of the reflector is made into a non-ellipsoidal surface of revolution, or a cross section having an ellipsoidal surface of revolution is extended orthogonally to the cross section by a predetermined length, the range of the other focus expands. In addition, by arranging a plurality of reflectors, it is possible to hear different sounds within the effective areas of the respective reflectors without mutual interference of the sounds.

1 Claim, 3 Drawing Sheets

ACOUSTIC APPARATUS

This application is a continuation of U.S. application Ser. No. 07/853,026 filed Mar. 18, 1992, now abandoned, which is a continuation of U.S. application Ser. No. 07/560,761, filed Jul. 31, 1990, now abandoned.

BACKGROUND OF THE INVENTION

1. Field of the Invention

The present invention relates to an acoustic apparatus, and more particularly to an acoustic apparatus employing the principle of an acoustic lens constituted by a reflector.

2. Description of the Related Art

There has long been a demand for directing sounds so as to be heard by only a specific person or persons or at only a specific space or spaces without disturbing the surrounding people and so on. A loudspeaker as a means of amplifying sounds is generally known. Furthermore, an earphone which is inserted in the external auditory meatus is extensively employed for general use or as a hearing aid.

The principle of an acoustic lens is conventionally known: Sound waves from a sound source are applied to a variously curved reflector having a focus, and the reflected sound waves are caused to diverge or scatter. Although this principle is applicable to buildings such as outdoor and indoor concert halls, it has not been put to practical use, and its effect has not been ascertained.

However, the aforementioned earphone gives discomfort to a wearer when it is inserted into the external auditory meatus. Hence, there has been the problem that there are very many cases where persons having slight or moderate difficulty in hearing do not use the hearing aid, especially not for long hours, owing to the discomfort and are inconvenienced as a result.

In addition, as for the conventional loudspeakers, since the range of sounds issuing therefrom cannot be restricted to a specific space, the loudspeakers exert a large influence on surrounding people and so on.

SUMMARY OF THE INVENTION

Accordingly, a primary object of the present invention is to provide an acoustic apparatus with a reflector which is capable of amplifying sounds and focusing them so as to be heard only within a specific area without the user using an earphone, without needing to be worn by the user, and without affecting surrounding people and so on as in the case of a general speaker, thereby overcoming the above-described drawback of the conventional art.

A second object of the present invention is to provide an acoustic apparatus which allows a sound source to be positioned irrespective of the aforementioned acoustic apparatus, and which does not disturb a sound field, which could otherwise occur depending on the size of a sound source device, such as a loudspeaker, installed within the effective range of the reflector.

A third object of the present invention is to provide an acoustic apparatus which is capable of specifying a plurality of persons to hear the sounds.

Furthermore, in the arrangement of the above-described conventional loudspeakers, there is a problem in that even if an attempt is made to satisfy a demand for selecting from a plurality of different sounds in one space, the sounds become mixed with each other, cannot be discriminated, and become mere dual sounds or noises. The present invention overcomes this problem as well, and a fourth object of the present invention is to provide an acoustic apparatus which makes it possible for the user to select from a plurality of kinds of sound in one space.

In accordance with the present invention, the aforementioned primary object is attained by a first aspect of the invention according to which there is provided an acoustic apparatus comprising: a reflector whose inner surface is provided with part of an ellipsoidal surface of revolution having two foci; and a sound source disposed at one of said foci, whereby sounds reflected by said reflector are made to converge into the other focus.

In accordance with this first aspect of the invention, since an ellipsoidal surface of revolution has two foci, sounds issuing from the sound source placed at one focus are transmitted to the user located at the other focus in converged form, and sounds can be heard positively and in amplified form. As the user moves away from the focus, the sound pressure becomes sharply smaller, so that no influence is exerted on other people and the like outside the apparatus. As such, sounds can be heard in amplified form only by a person located at the other focus.

The second object is attained by a second aspect of the invention according to which there is provided an acoustic apparatus comprising: a reflector whose inner surface is provided with part of an ellipsoidal surface of revolution having two foci; and a sound conducting pipe which extends from a sound source disposed outside said reflector to one of said foci of said reflector and whose opening at a tip thereof is directed toward the inner surface of said reflector at a position of said one of said foci.

In accordance with the second aspect of the invention, sounds issuing from the sound source pass through the sound conducting pipe, are directed to the reflector from an opening provided at the tip of the sound conducting pipe located at one focus of the ellipsoidal surface of revolution, and are focused at the other focus. At that juncture, unlike a conventional acoustic lens in which a loudspeaker is disposed at one focus, sounds of as large an output as desired can be made to issue. As a result, sounds of a sufficient level can be heard even with a small-diameter ellipsoid of revolution in accordance with this aspect of the invention.

The third object is attained by a third aspect of the invention according to which there is provided an acoustic apparatus comprising: a reflector with a central portion of an inner surface thereof constituted by a paraboloid of revolution, and with a peripheral portion thereof constituted by part of an ellipsoidal surface of revolution having two foci; and a sound source disposed at one of the foci.

In accordance with this third aspect of the invention, sounds issuing from one focus are reflected in parallel within the effective range of the paraboloid of revolution provided at the central portion, while they are reflected from the ellipsoidal surface of revolution in the peripheral portion toward the other focus. Accordingly, a plurality of specific persons are able to hear the sounds within the effective range of the paraboloid of revolution without causing the sounds to affect other people located outside the apparatus.

In addition, the third object of the invention can be attained by a fourth aspect of the invention according to which there is provided an acoustic apparatus comprising: a reflector whose inner surface in one cross section thereof is provided with part of an ellipse having two foci, the part of the ellipse extending orthogonally to the cross section; and a sound source disposed at one of the foci.

In accordance with this fourth aspect of the invention, it becomes possible for a plurality of specific persons to hear sounds in a belt-like area having a width with the other focus extending in a belt-like configuration as a center.

It should be noted that in the third and fourth aspects of the invention, since the reflector can be made relatively large, the size of the speaker box does not account for a large proportion with respect to that of the reflector, so that the effect of irregular reflection is small, and a loudspeaker may be used as a sound source.

The fourth object of the invention is attained by a fifth aspect of the invention according to which there is provided an acoustic system wherein a set of acoustic apparatus is formed by disposing a sound producing device at one focus of a reflector provided with part of an ellipsoidal surface of revolution having two foci, and wherein a plurality of sets of acoustic apparatus are arranged in such a manner that adjacent ones of the reflectors are spaced apart from each other a predetermined distance.

In accordance with this aspect of the invention, sounds issuing from one focus are amplified by each reflector and are provided with sharp directivity toward the other focus, so that it is possible to hear different sounds in a concentrated manner at the positions of the other foci of the respective reflectors. In addition, since the attenuation factor of sounds in a perpendicular direction to the direction of reflection is high, as the user moves away from the other focus, the sounds from the loudspeaker at one focus are quickly masked by the surrounding noise, so that it becomes impossible for the user to hear the sounds from an adjacent reflector. Thus sounds issuing from adjacent reflectors do not affect each other.

Accordingly, even if a plurality of different sounds, e.g., speech in different languages, different music, and different presentations, are given through the respective reflectors, persons who are situated below the respective reflectors can hear only specific sounds, thereby making it possible to form independent acoustic spaces below the respective reflectors.

The above and other objects, features and advantages of the present invention will become more apparent from the following detailed description of the invention when read in conjunction with the accompanying drawings.

DESCRIPTION OF THE PREFERRED EMBODIMENTS

Referring now to the accompanying drawings, a detailed description will be given of the embodiments of the present invention.

Figure 1:
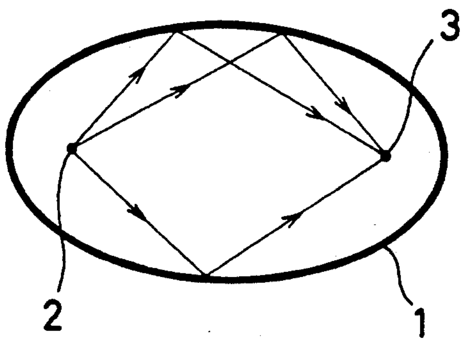
FIG. 1 is a diagram schematically illustrating the basic principle of the present invention.

FIG. 1 illustrates the basic principle of the present invention, and a hollow ellipsoid of revolution 1 has two foci 2, 3.

If light, sound waves or the like issue from one focus 2, the light, sound waves or the like are reflected by the inner surface of the ellipsoid of revolution 1, and reach the other focus 3. If a source for producing sounds or the like is placed at the other focus 3, sounds or the like produced reach the one focus 2.

The present invention is an application of this basic principle, and the specific embodiments of the present invention will be described hereinafter.

FIRST EMBODIMENT

Figure 2:
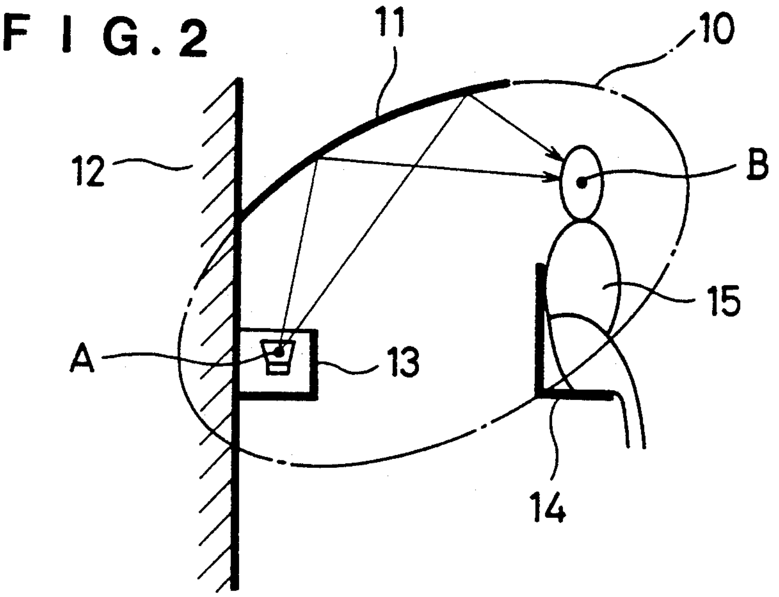
FIG. 2 is a diagram schematically illustrating an apparatus in accordance with a first embodiment.

FIG. 2 illustrates a first embodiment of the present invention. In the drawing, reference numeral 10 denotes the surface of an ellipsoid of revolution, and numeral 11 denotes a reflector having part of the surface of this ellipsoid of revolution.

One end of the reflector 11 is affixed to a wall surface 12. The area of the reflector 11 is set depending on a scale.

A sound producing means 13, i.e, a sound source, is disposed at one focus A of the ellipsoid of revolution 10, the focus A being located on the wall surface 12.

Meanwhile, a chair 14 is disposed in the vicinity of the other focus B of the ellipsoid of revolution 10, and consideration is so given that when a user 15 is seated in the chair 14, his or her head is located substantially at the other focus B.

In the above-described structure, if the user 15 is seated in the chair 14 and sounds are produced from the sound producing means 13, the sounds are reflected by the reflector 11 and converge at the head of the user 15 located at the focus B.

This phenomenon takes place regardless of the distance between the foci A and B, but the greater the area of the reflector 11, the greater the sound-directing effect.

As described above, the sounds from the sound producing means 13 reach only the specific user 15 located at the other focus B or it vicinity, and the specific user 15 is able to hear these sounds in amplified form.

It goes without saying that the user 15 may be a person either with or without difficulty in hearing. Only the user is capable of listening to music or the like at the other focus B or it vicinity. Since the sounds issuing from the apparatus do not reach areas other than the reflector 11, no influence is exerted on persons located outside the reflector 11.

In addition, if the above-described apparatus is applied to a structure such as a restaurant and is arranged in such a manner that the position of the reflector 11 can be displaced (moved and/or inclined) together with the sound producing means 13, it is possible to change the position of the focus B in a room, allow an arbitrary specific group in the room to be selected and allow the sounds to be heard by that group in amplified form.

In the apparatus of this embodiment, if a light source is disposed at one focus together with the sound source, and the reflector is provided with a light-reflecting surface, the apparatus is also provided with the function of an illuminating lamp and facilitates reading and the like. In addition, it is possible to visually confirm the position of the other focus into which the sounds are made to converge, thereby facilitating the use of the apparatus.

Figure 3:
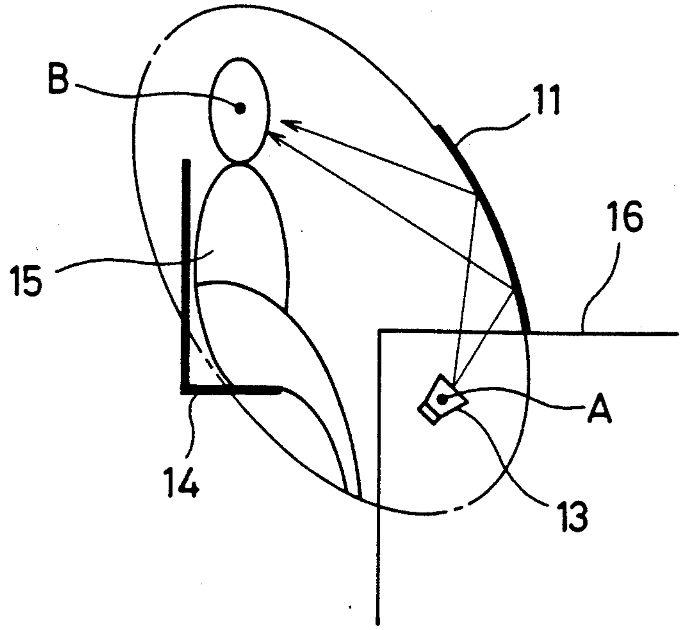
FIG. 3 is a diagram schematically illustrating a modification of the first embodiment.

The present invention can be adopted not only as the wall type such as the one shown in FIG. 2 but also as a desk-top type as shown in FIG. 3.

In the example shown in FIG. 3, the reflector 11 is provided on a desk 16, and the sound producing means 13 is accommodated in the desk 16.

Even if such a structure is adopted, the sounds from the sound producing means 13 located at the focus A can be made to converge for only the user 15 located at the focus B in the same way as FIG. 2.

Furthermore, the apparatus of this embodiment may be used as a floor mounted type with legs. In that case, the position of the apparatus can be readily changed.

As described above, in accordance with this embodiment, sounds can be made to converge into a specific spot, and the apparatus can function as a hearing aid apparatus without an earphone for a person having difficulty in hearing, and as an acoustic apparatus for a person having no difficulty in hearing.

SECOND EMBODIMENT

A description will now be given of a second embodiment which makes it possible to prevent a loudspeaker, i.e., a sound source, from disturbing a sound field owing to the magnitude of its sounds.

Figure 4:
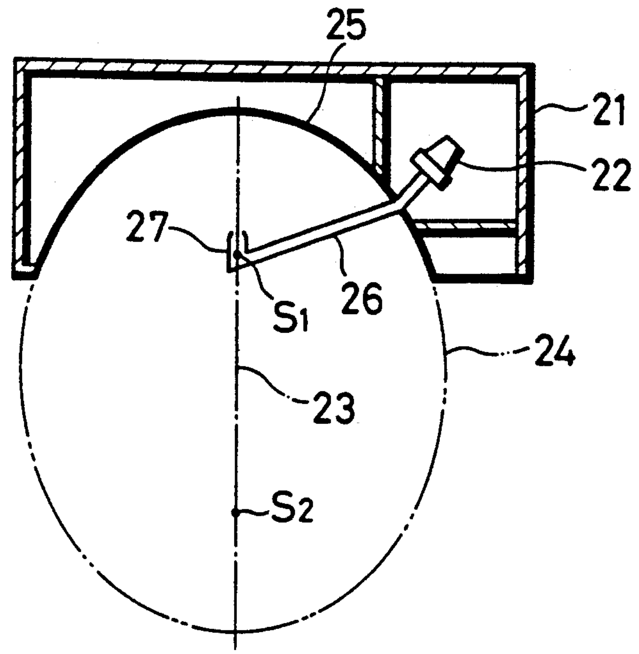
FIG. 4 is a vertical cross-sectional view of an apparatus in accordance with a second embodiment.

In the second embodiment shown in FIG. 4, a support 21 is affixed to a structure, and a loudspeaker 22 serving as a sound source is installed in it.

Fixed to the support 21 is a reflector 25 having, as its internal surface, part of the surface of an ellipsoid 24 which has an axis 23, e.g., a vertical line in the illustrated case, as an axis of revolution and has two foci $S_1$ and $S_2$ on the axis 23.

Furthermore, a sound conducting pipe 26 is provided in such a manner as to extend from the loudspeaker 22 toward one focus (the upper one in the illustrated case) $S_1$ of the reflector 25, and a nozzle 27 is provided at the tip of the sound conducting pipe 26 in such a manner as to face the center of the reflector 25. It should be noted that it suffices if, without using the nozzle, an opening at the tip of the sound conducting pipe is directed toward the reflector and its configuration is made suitable for the issuance of sounds.

In the apparatus of this embodiment thus constructed, if sounds are made to issue from the loudspeaker 22, the sounds pass through the sound conducting pipe 26, reach the nozzle 27 located at the focus $S_1$, and are directed from the nozzle 27 to the reflector 25. The sounds are reflected by the reflector 25 and converge at the focus $S_2$ without leaking to the outside. Accordingly, if the user places his or her head at the position of the focus $S_2$, he or she is able to hear the sounds thus made to converge. At that juncture, in this embodiment, since the loudspeaker 22 is disposed outside the reflector, it is possible to increase the output of the loudspeaker 22 without disturbing the sound field inside the reflector 25.

Thus, in accordance with this embodiment, since the sound conducting pipe for issuing sounds is disposed at one focus of the ellipsoidal surface of revolution, and the loudspeaker or the like serving as a sound source is disposed outside the reflector, the sound field inside the reflector is not disturbed even if a loudspeaker with a large output is used with respect to the reflector having a small diameter. As a result, it is possible to increase the level of the focused sounds to a predetermined level or more.

THIRD EMBODIMENT

Figure 5:
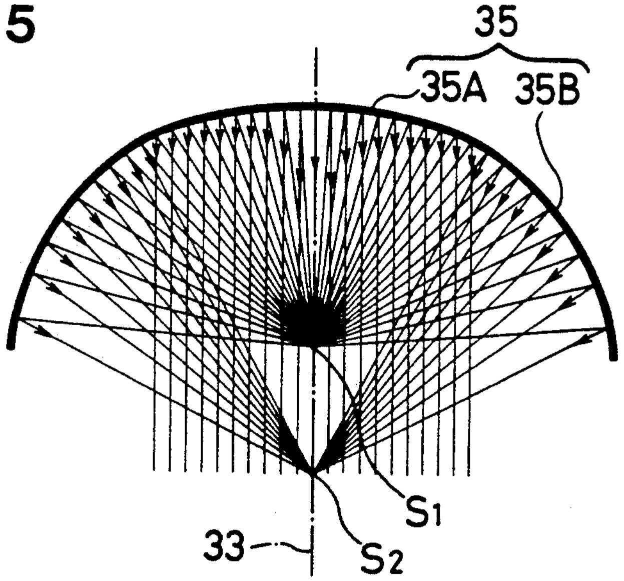
FIG. 5 is a vertical cross-sectional view of an apparatus in accordance with a third embodiment.

In accordance with a third embodiment shown in FIG. 5, it is possible to expand the area for hearing sounds with the focus $S_2$ as a center, and the sound level in that area becomes substantially uniform.

In this embodiment, as for the inner surface of a reflector 35, its central portion centering on an axis 33 is formed by a paraboloid of revolution 35A, and its peripheral portion by a ellipsoidal surface of revolution 35B.

In this embodiment, as for the sound source disposed at the focus $S_1$, it is possible to use a loudspeaker as the sound source by increasing the diameter of the reflector to minimize the effect of a speaker box, without using the nozzle as in the preceding embodiment.

In the acoustic apparatus of this embodiment constructed as described above, sounds are reflected in parallel by the paraboloid of revolution 35A at the central portion.

Meanwhile, the sounds are reflected by the ellipsoidal surface of revolution 35B, i.e., the peripheral portion, toward the focus $S_2$, and are mixed with the sounds reflected by the paraboloid of revolution 35A. Accordingly, it is possible to obtain a predetermined sound level within the area covered by the paraboloid of revolution 35A, thereby making it possible for a plurality of persons to hear the sounds within that area. The sound level in that area becomes substantially uniform.

In this embodiment, by adjusting the area of the paraboloid of revolution 35A, it is possible to cope with the varying number of people who hear the sounds.

FOURTH EMBODIMENT

Figure 6:
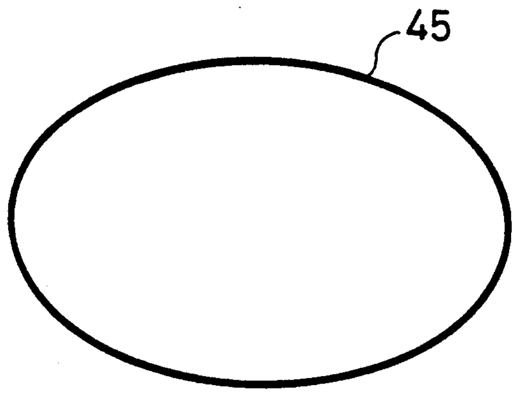
FIG. 6 is a horizontal cross sectional view of a reflector of an apparatus in accordance with a fourth embodiment.

An increased number of users can also be coped with by an acoustic apparatus in accordance with a fourth embodiment which is provided with a reflector 45, a cross section thereof being shown in FIG. 6. In FIG. 6, in a state in which in terms of its configuration an inner surface of the reflector 45 is provided with part of an ellipse having two foci in one cross section thereof, that part of the ellipse extends orthogonally to that cross section. As a result, that the user is capable of hearing sounds focused in that area. In practice, this area has a sufficient width for hearing sounds at the linear focus and forms a belt-like area. In this embodiment as well, a loudspeaker can be used as a sound source in the same way as the third embodiment.

FIFTH EMBODIMENT

A fifth embodiment of the invention is arranged such that the users can hear sounds by selecting from a plurality of kinds of sound in one space at a plurality of positions without mutual interference of the sounds.

Figure 7:
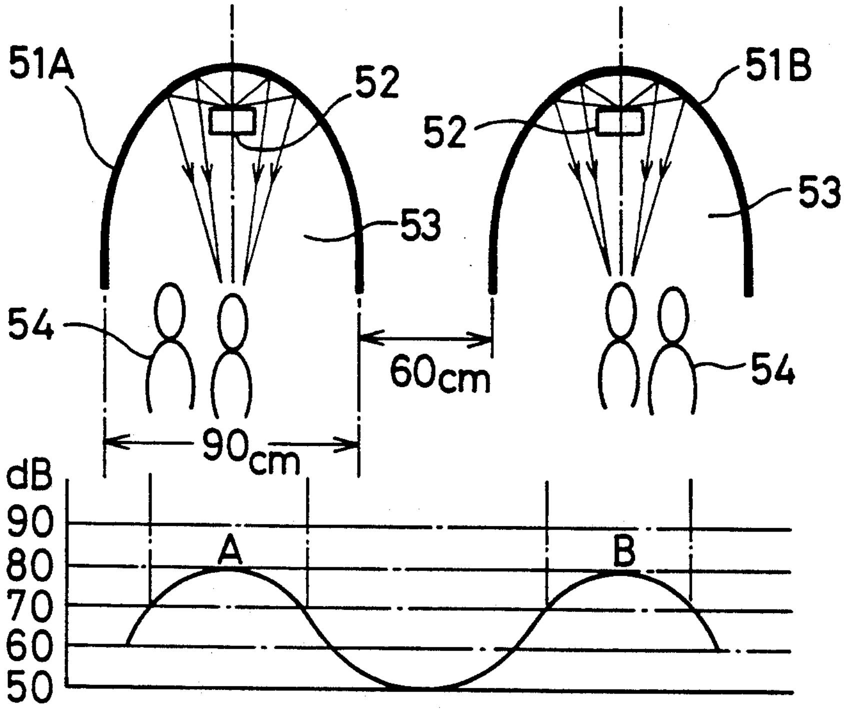
FIG. 7 is a diagram schematically illustrating an apparatus in accordance with a fifth embodiment.

FIG. 7 illustrates this embodiment, and in this example two umbrella-like reflectors 51A, 51B are used.

Each of these reflectors 51A, 51B has an ellipsoidal surface of revolution having two foci, a loudspeaker 52 being disposed at its respective one focus in a fixed position. Different sounds are supplied to these two loudspeakers 52, 52.

The sounds issuing from each loudspeaker 52 are reflected by the ellipsoidal surface and converge as sound waves 53 having sharp directivity toward the other focus.

The users 54 who are in the area where the sound waves are present can hear the sounds under the respective reflectors 51A, 51B, which exhibit sound pressure level distributions as shown in FIG. 7.

The curve shown by solid line A is the sound pressure level distribution of the reflector 51A, while the curve shown by solid line B is that of the reflector 51B.

This example is a case where the level of the surrounding noise (background noise) is 60 dB, and if it is assumed that the distance between the two reflectors (distance between their adjacent peripheral edges) is 60 cm, and the diameter of each reflector is 90 cm, the sounds issuing from the loudspeakers of the reflectors 51A, 51B are amplified through reflection and convergence and come to have sharp directivity, as described above. In addition, since the attenuation of the sound pressure level in the surroundings is large, as shown by the curve in FIG. 7, the sounds from the reflector 51A are masked by the surrounding noise and therefore cannot be heard under the reflector 51B. The reverse is also true.

In other words, independent acoustic spaces are formed by the reflectors 51A, 51B, respectively.

Specifically, in the example shown in FIG. 7, in cases where the level of the surrounding noise, i.e., the background noise, is 60 dB, the sounds from the outside cannot be heard in the areas covered by the respective reflectors unless the sound pressure of 60 dB+10 dB=70 dB or above is transmitted from the outside.

In contrast, in the illustrated ranges A and B of the reflectors, the levels of reflected and converging signal sounds from the sound sources are 70 dB or more in the respective cases, and it can be appreciated that these signal sounds are at very sufficient levels.

The level of the surrounding noise is about 50 dB at general places such as quiet exhibitions, and about 75 dB at noisy places, but in either case it is impossible to hear the outside sounds within the areas of the respective reflectors unless sound pressure of the surrounding noise+10 dB or more is present.

If the above-described structure is adopted, in the case of an exhibition, for instance, the acoustic apparatus of the invention can be used for presentation of adjacent panels using different contents or languages.

In addition, the acoustic apparatus can also be used as an acoustic facility in a train station or other public facilities for the purposes of public addressing or announcement only at a specific place for those having slight or moderate difficulty in hearing. Also, the acoustic apparatus is optimally suited as an acoustic facility in a section for those who are hard of hearing at concert halls, lecture halls, and the like.

In restaurants equipped with music facilities, the acoustic apparatus can be used for amplifying music so as to be heard only by a specific group of people or for making an announcement to specific people.

Furthermore, in ordinary cases, if this acoustic apparatus is installed above a chair or a seat as an amplifier which does not require an earphone, it is possible to allow sounds to be heard only by the user without causing trouble to others.

In addition, as a method of usage for relieving the user of the trouble of wearing the earphone for long hours, the acoustic apparatus is quite practical in the transmission of speech in international conferences, training facilities, and so on.

Figure 8:
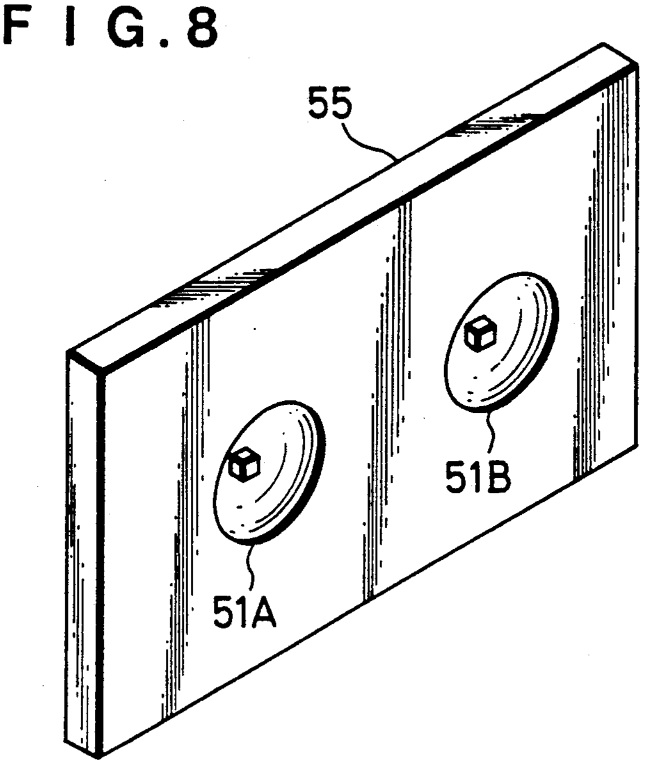
FIG. 8 is a perspective view illustrating a modification of the fifth embodiment.

FIG. 8 illustrates a modification of the apparatus of this embodiment, showing an example in which acoustic apparatus 51A, 51B are constructed integrally with a ceiling panel 55 and are incorporated as a part of the structure. If this construction is adopted, the apparatus can be applied quite readily to various structures such as restaurants and conference halls.

As is apparent from the foregoing description, in accordance with this embodiment, it is possible to transmit a plurality of different sounds to specific places in one space.

What is claimed is:

1. An acoustic apparatus comprising:

a plurality of reflectors which are downwardly open, each of said reflectors being formed by a closed upper portion of an ellipsoidal surface of revolution which is obtained when a ellipse having two foci on an axis extending in a substantially vertical direction is rotated about the axis, said closed upper portion enveloping at least an upper one of the two foci, said plurality of reflectors being disposed at a predetermined distance from each other with their axes parallel to each other; and mutually different sound sources which are respectively disposed at positions of the upper foci of said reflectors and facing upwardly, a lower one of the two foci of each of said reflectors being located in a vicinity of the head of a listener, wherein a sound pressure value of a sound on the axis of at least one of said reflectors is set to be higher by a predetermined value than a value of background noise occurring outside said one of said reflectors, and wherein said predetermined distance is determined such that a sound pressure of a sound which reaches the axis of said one of said reflectors after being focused at the lower one of the two foci of another reflector and being attenuated in a radial direction is lower than the value of said background noise.

* * * * *